United States Patent
Kondo

(10) Patent No.: US 9,557,561 B2
(45) Date of Patent: Jan. 31, 2017

(54) METHOD FOR MANUFACTURING ELECTRO-OPTICAL DEVICE, ELECTRO-OPTICAL DEVICE, AND ELECTRONIC APPARATUS

(71) Applicant: SEIKO EPSON CORPORATION, Tokyo (JP)

(72) Inventor: Manabu Kondo, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/018,086

(22) Filed: Feb. 8, 2016

(65) Prior Publication Data

US 2016/0282608 A1    Sep. 29, 2016

(30) Foreign Application Priority Data

Mar. 27, 2015  (JP) .................................. 2015-065932

(51) Int. Cl.
  *G02B 26/00*  (2006.01)
  *G02B 26/08*  (2006.01)
  *H01L 21/78*  (2006.01)

(52) U.S. Cl.
  CPC ........... *G02B 26/0833* (2013.01); *H01L 21/78* (2013.01)

(58) Field of Classification Search
  CPC .............................. G02B 26/0841; G02B 6/43
  USPC .................................. 359/245–279, 290–297
  See application file for complete search history.

(56) References Cited

U.S. PATENT DOCUMENTS

| | | | |
|---|---|---|---|
| 6,856,014 B1 | 2/2005 | Ehmke et al. | |
| 2005/0057331 A1* | 3/2005 | Murata | ................... B81B 7/007 335/78 |

FOREIGN PATENT DOCUMENTS

JP    2009-048009 A    3/2009

\* cited by examiner

*Primary Examiner* — Mahidere Sahle
(74) *Attorney, Agent, or Firm* — Oliff PLC

(57) ABSTRACT

After a first wafer on which mirrors and terminals are formed and a second wafer for sealing are stacked and bonded together, the first wafer and the second wafer are diced to manufacture electro-optical devices. In doing so, in a second surface of the second wafer, recesses overlapping the mirrors in a plan view are previously formed, and also grooves overlapping the terminals in the plan view are previously formed. For this reason, when the second wafer is diced along the grooves by advancing a dicing blade for second wafer from a third surface of the second wafer, the dicing blade for second wafer can be prevented from coming into contact with the terminal.

5 Claims, 11 Drawing Sheets

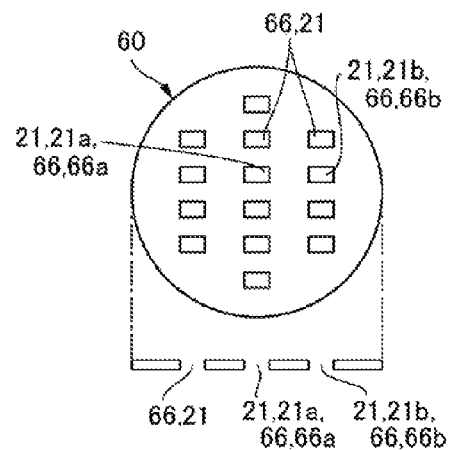
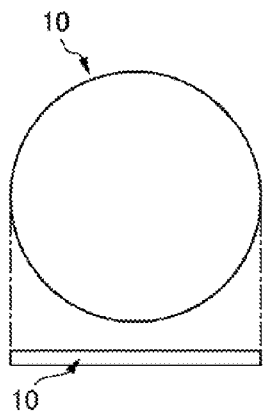
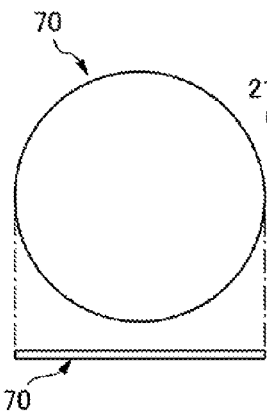
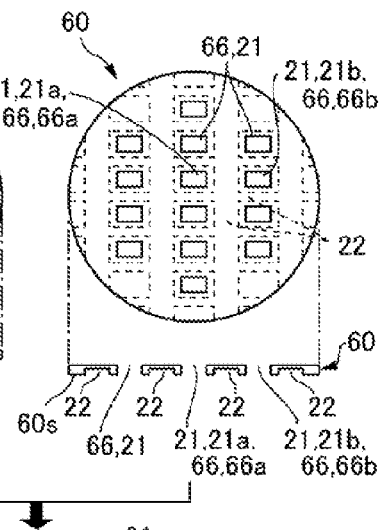
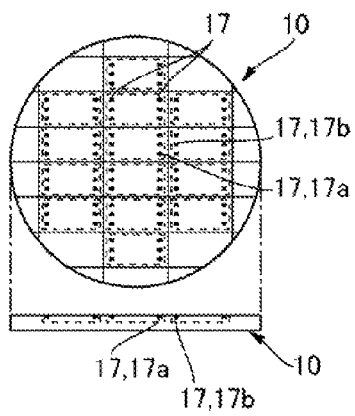
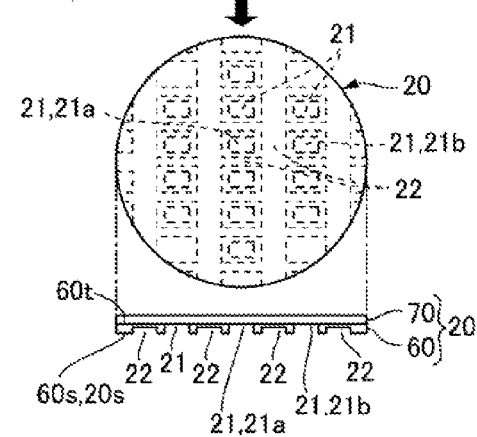

METHOD FOR MANUFACTURING ELECTRO-OPTICAL DEVICE, ELECTRO-OPTICAL DEVICE, AND ELECTRONIC APPARATUS

The entire disclosure of Japanese Patent Application No. 2015-065932, filed Mar. 27, 2015 is expressly incorporated by reference herein.

BACKGROUND

1. Technical Field

The present invention relates to a method for manufacturing an electro-optical device including a mirror, an electro-optical device, and an electronic apparatus.

2. Related Art

As an electronic apparatus, for example, a projection type display device or the like is known. The projection type display device or the like modulates light emitted from a light source with a plurality of mirrors (micromirrors) of an electro-optical device called a DMD (digital mirror device), and then enlarges and projects the modulated light with a projection optical system to thereby display an image onto a screen. The electro-optical device used for the projection type display device or the like includes an element substrate 1 as shown in FIG. 11D. The element substrate 1 includes, on one surface 1s side, mirrors 50 and terminals 17 provided at positions next to the mirrors 50 in a plan view. Moreover, the element substrate 1 is sealed by a spacer 61 and a plate-like light-transmitting cover 71. The spacer 61 is bonded on the one surface 1s side of the element substrate 1 so as to surround the mirrors 50 and the terminals 17 in the plan view. The light-transmitting cover 71 is supported to an edge of the spacer 61 on the side opposite to the element substrate 1.

To manufacture the electro-optical device shown in FIG. 11D, for example, a manufacturing method described below is proposed (see U.S. Pat. No. 6,856,014 B1). First, as shown in FIG. 11A, a first wafer 10 including the mirrors 50 and the terminals 17 on one surface 10s side is formed, while a wafer 60 for spacer in which through-holes 66 are formed and a light-transmitting wafer 70 are stacked and bonded together to form a second wafer 20. As a result, the through-holes 66 serve as bottomed recesses 21. Next, as shown in FIG. 11B, the first wafer 10 and the second wafer 20 are bonded together in a manner such that the recesses 21 overlap the mirrors 50 in a plan view. Next, as shown in FIG. 11C, a dicing blade 82 for second wafer is advanced to the second wafer 20 from the side opposite to the first wafer 10 to dice the second wafer 20 and expose the terminals 17. Next, as shown in FIG. 11D, the first wafer 10 is diced with a dicing blade 81 for first wafer to obtain a plurality of electro-optical devices 100.

In the manufacturing method shown in FIGS. 11A to 11D, however, the second wafer 20 is stacked in a state of being in contact with the terminals 17 as shown in FIG. 11B. Accordingly, when the second wafer 20 is diced in the step shown in FIG. 11C, there is a problem in that the dicing blade 82 for second wafer may come in contact with the terminal 17 and cause damage to the terminal 17.

SUMMARY

An advantage of some aspects of the invention is to provide a method for manufacturing an electro-optical device by which even when a stacked and bonded wafer is diced to expose a terminal, damage to the terminal can be prevented, an electro-optical device, and an electronic apparatus.

A method for manufacturing an electro-optical device according to an aspect of the invention includes: preparing a first wafer including, on a first surface side, a first mirror, a first terminal, a second mirror, and a second terminal, the first terminal being provided at a position next to the first mirror in a plan view, the first terminal being electrically connected to a first drive element driving the first mirror, the second mirror being located on the side opposite to the first mirror with respect to the first terminal, the second terminal being provided between the first terminal and the second mirror, the second terminal being electrically connected to a second drive element driving the second mirror; forming a second wafer including a second surface provided with a first recess having a light-transmitting bottom portion, a second recess having a light-transmitting bottom portion, and a groove between the first recess and the second recess; bonding the first surface of the first wafer and the second surface of the second wafer together in a manner such that the first recess overlaps the first mirror in the plan view, that the second recess overlaps the second mirror in the plan view, and that the groove overlaps in the plan view the first terminal, the second terminal, and an area interposed between the first terminal and the second terminal; dicing the second wafer along the groove by advancing a first dicing blade from a third surface of the second wafer on the side opposite to the second surface; and dicing the first wafer between the first terminal and the second terminal with a second dicing blade.

In the aspect of the invention, after the first wafer and the second wafer for sealing are bonded together, the first wafer and the second wafer are diced to manufacture a plurality of electro-optical devices. In doing so, the groove overlapping in the plan view the first terminal, the second terminal, and the area interposed between the first terminal and the second terminal is previously formed in the second wafer in addition to the first recess overlapping the first mirror and the second recess overlapping the second mirror. For this reason, the second wafer is separated from the first terminal and the second terminal in a state where the first wafer and the second wafer are bonded together. For this reason, the first terminal and the second terminal are not bonded to the second wafer. Moreover, in the dicing of the second wafer, the second wafer is diced before the dicing blade for second wafer comes close to the first terminal and the second terminal. Accordingly, the dicing blade for second wafer is less likely to come into contact with the first terminal and the second terminal and cause damage to the first terminal and the second terminal. Hence, the yield of the electro-optical device can be improved.

The invention may employ a configuration in which the thickness of the second dicing blade is smaller than the thickness of the first dicing blade and in the dicing of the first wafer, the first wafer is diced by advancing the second dicing blade to the first wafer from the second surface side. According to the configuration, after the dicing of the second wafer, a step of turning over a stacked body of the first wafer and the second wafer is not necessary before the dicing of the first wafer.

The invention may employ a configuration in which the thickness of the first dicing blade is greater than the width of the groove. An electro-optical device manufactured according to this configuration includes: an element substrate including a mirror and a terminal on a first surface side, the terminal being provided at a position next to the mirror in a plan view, the terminal being electrically connected to a drive element driving the mirror; and a sealing member including a spacer and a plate-like light-transmitting cover, the spacer being bonded on the first surface side of the element substrate and surrounding the mirror in the plan view, the light-transmitting cover being supported to an edge of the spacer on the side opposite to an edge thereof facing the element substrate, the light-transmitting cover overlapping the mirror in the plan view, wherein in a side surface of the sealing member, a second portion closer to the element substrate than a first portion projects opposite to the mirror beyond the first portion. According to the configuration, it is easy to connect the terminal provided on the substrate with another terminal by wire bonding. Also in this case, since the area (bonding width) of bonding the sealing member with the substrate is not reduced, a sealing property between the sealing member and the substrate is not reduced.

The invention may employ a configuration in which the thickness of the first dicing blade is smaller than the width of the groove. An electro-optical device manufactured according to this configuration includes: an element substrate including a mirror and a terminal on a first surface side, the terminal being provided at a position next to the mirror in a plan view, the terminal being electrically connected to a drive element driving the mirror; and a sealing member including a spacer and a plate-like light-transmitting cover, the spacer being bonded on the first surface side of the element substrate and surrounding the mirror in the plan view, the light-transmitting cover being supported to an edge of the spacer on the side opposite to an edge thereof facing the element substrate, the light-transmitting cover overlapping the mirror in the plan view, wherein in a side surface of the sealing member, a second portion closer to the element substrate than a first portion is recessed to the mirror side beyond the first portion.

In the aspect of the invention, it is preferable that a multistage blade including the second dicing blade and the first dicing blade stacked together in a thickness direction is used, and that the dicing of the second wafer and the dicing of the first wafer are continuously performed by advancing the multistage blade to the first wafer from the second wafer side.

The invention may employ a configuration in which the forming of the second wafer includes forming a first through-hole, a second through-hole, and the groove in a third wafer, and stacking and bonding a light-transmitting fourth wafer on and to a surface of the third wafer on the side opposite to the side where the groove is opened.

The invention may employ a configuration in which the forming of the second wafer includes forming a first through-hole and a second through-hole in a third wafer, stacking and bonding the third wafer and a light-transmitting fourth wafer together, and forming the groove in a surface of the third wafer on the side opposite to a surface thereof bonded with the fourth wafer.

The electro-optical device to which the invention is applied can be used for various types of electronic apparatuses, and in this case, the electronic apparatus is provided with a light source unit that irradiates the mirror with light source light. Moreover, when a projection type display device is configured as the electronic apparatus, the electronic apparatus is further provided with a projection optical system that projects light modulated by the mirror.

BRIEF DESCRIPTION OF THE DRAWINGS

The invention will be described with reference to the accompanying drawings, wherein like numbers reference like elements.

FIGS. 6A to 6F are step views showing a method for manufacturing a second wafer, etc. used for the manufacture of the electro-optical device to which the invention is applied.

DESCRIPTION OF EXEMPLARY EMBODIMENTS

Figure 1:
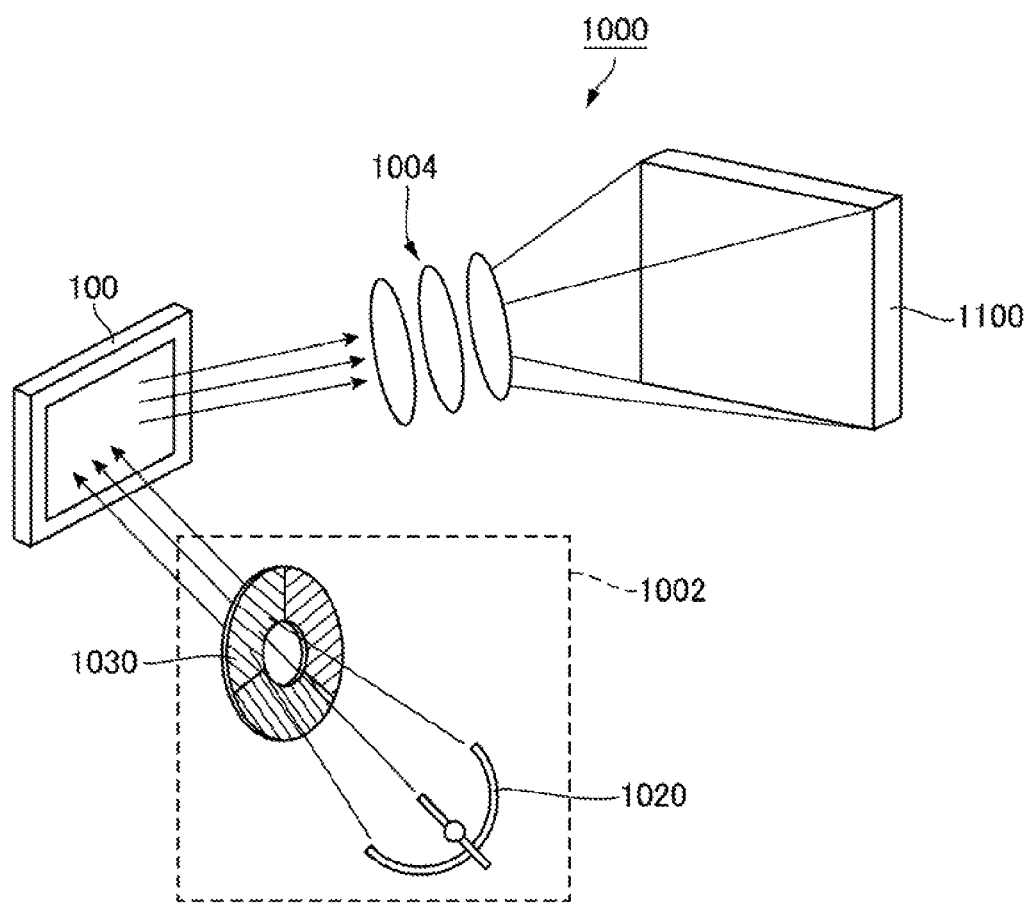
FIG. 1 is a schematic view showing an optical system of a projection type display device as an electronic apparatus to which the invention is applied.

An embodiment of the invention will be described with reference to the drawings. In the following description, a projection type display device will be described as an electronic apparatus to which the invention is applied. In the drawings to be referred to in the following description, layers or members are shown in different scales so that each of the layers or members has a recognizable size on the drawings. The numbers of mirrors, etc. shown in the drawings are set in a manner such that the mirror, etc. have a recognizable size on the drawings, but a larger number of mirrors, etc. than those shown in the drawings may be provided.

Projection Type Display Device as Electronic Apparatus

FIG. 1 is a schematic view showing an optical system of a projection type display device as an electronic apparatus to which the invention is applied. The projection type display device 1000 shown in FIG. 1 includes a light source unit 1002, an electro-optical device 100 that modulates light emitted from the light source unit 1002 in response to image information, and a projection optical system 1004 that projects as a projection image the light modulated by the electro-optical device 100 onto a projected object 1100 such as a screen. The light source unit 1002 includes a light source 1020 and a color filter 1030. The light source 1020 emits white light. The color filter 1030 emits lights of respective colors as the color filter rotates. The electro-optical device 100 modulates incident light at the timing in synchronization with the rotation of the color filter 1030.

Instead of the color filter 1030, a phosphor substrate that converts the light emitted from the light source 1020 into lights of respective colors may be used. Moreover, the light source unit 1002 and the electro-optical device 100 may be provided for each of lights of respective colors.

Basic Configuration of Electro-Optical Device 100

Figure 2A:
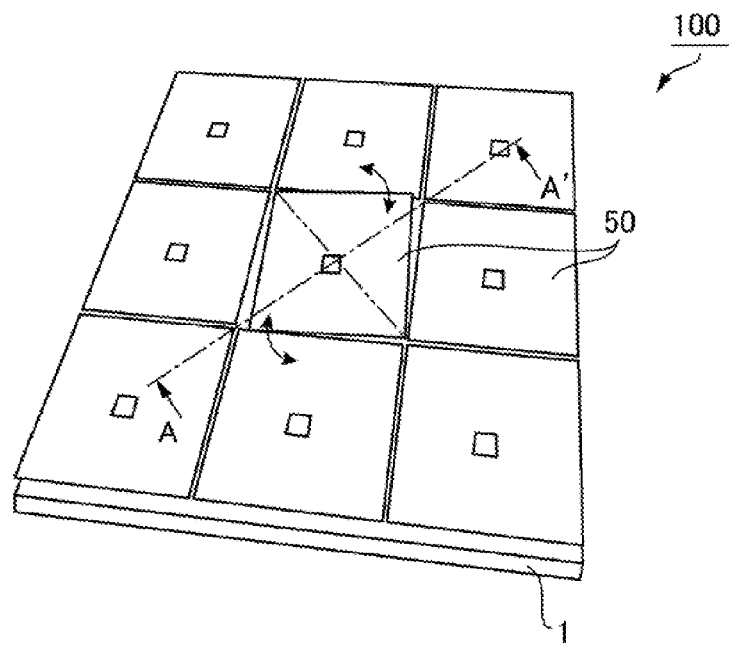
FIGS. 2A and 2B are explanatory views schematically showing a basic configuration of an electro-optical device to which the invention is applied.
Figure 2B:
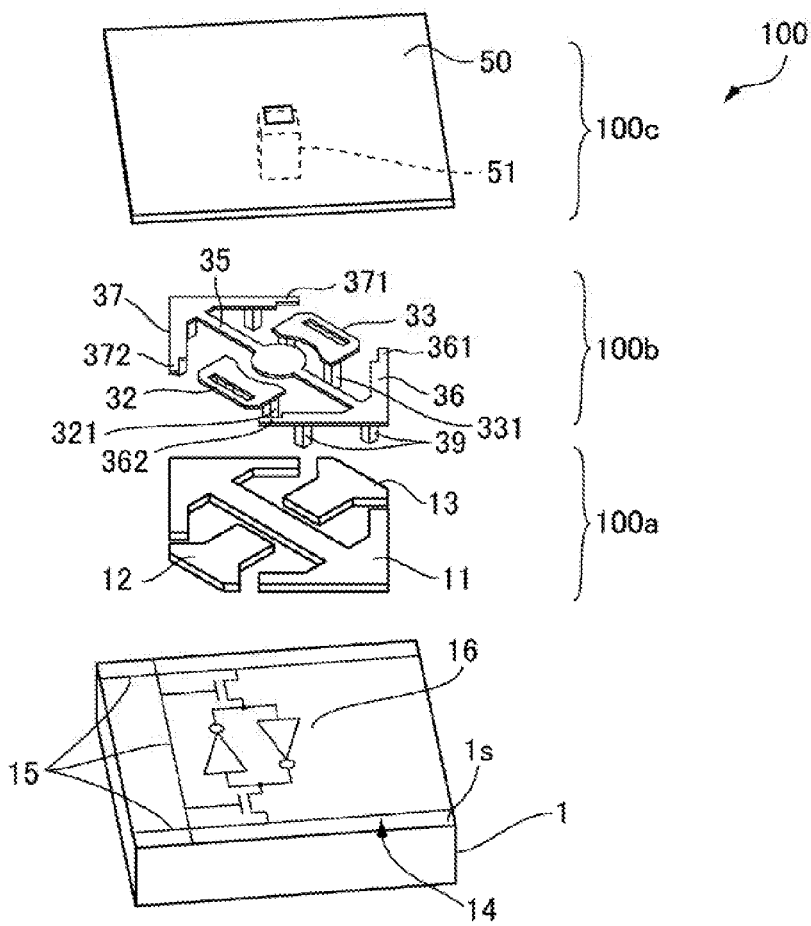
Figure 3A:
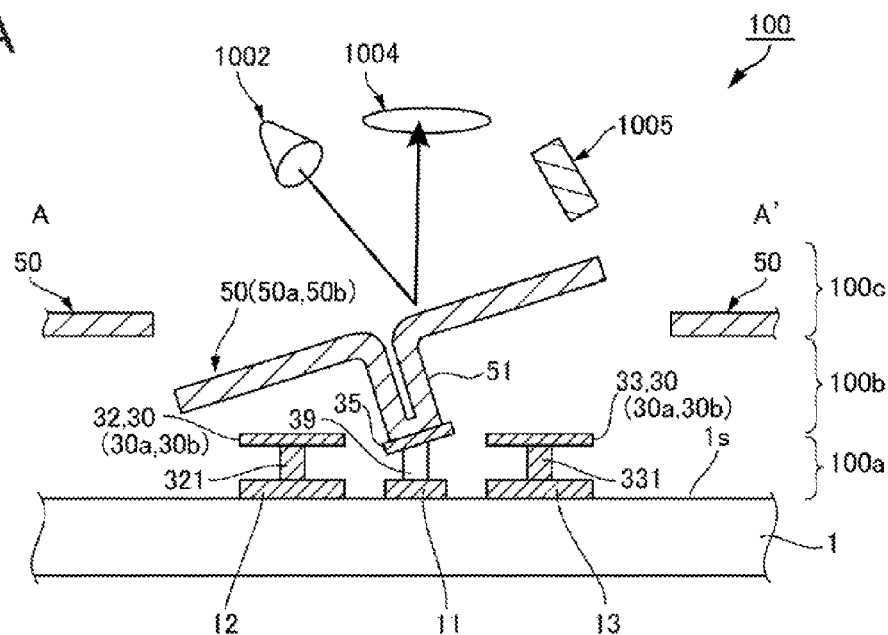
FIGS. 3A and 3B are explanatory views schematically showing a cross section taken along the line A-A' at a main portion of the electro-optical device to which the invention is applied.
Figure 3B:
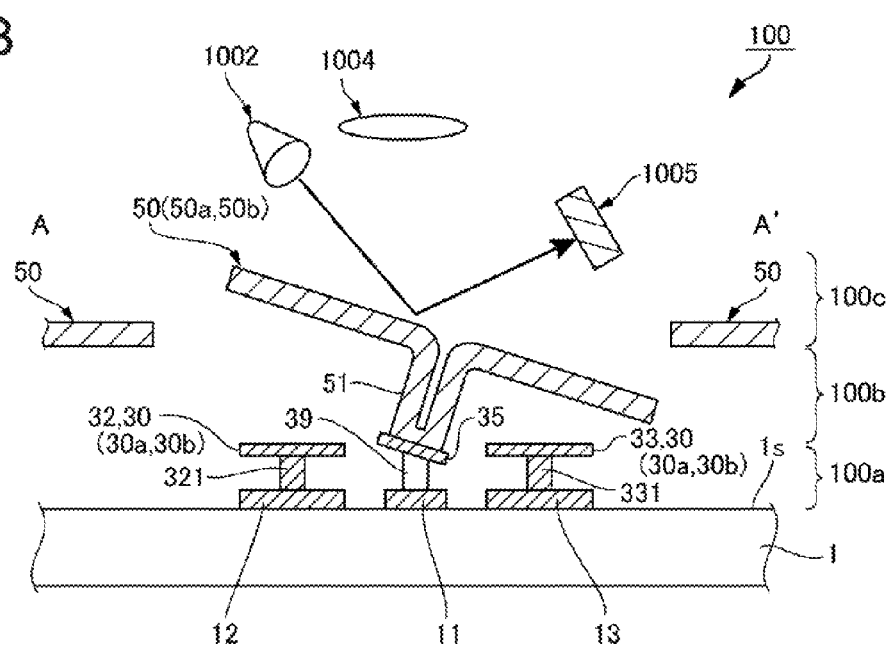

FIGS. 2A and 2B are explanatory views schematically showing a basic configuration of the electro-optical device 100 to which the invention is applied, in which FIG. 2A is an explanatory view showing a main portion of the electro-optical device 100, and FIG. 2B is an exploded perspective view of a main portion of the electro-optical device 100. FIGS. 3A and 3B are explanatory views schematically showing a cross section taken along the line A-A' at the main portion of the electro-optical device 100 to which the invention is applied, in which FIG. 3A is an explanatory view schematically showing a state where a mirror is inclined to one side, and FIG. 3B is an explanatory view schematically showing a state where the mirror is inclined to the other side.

As shown in FIGS. 2A to 3B, the electro-optical device 100 includes a plurality of mirrors 50 disposed in a matrix on one surface 1s (first surface) side of an element substrate 1. The mirrors 50 are separated from the element substrate 1. The element substrate 1 is, for example, a silicon substrate. The mirror 50 is, for example, a micromirror having a planar size with a side length of, for example, from 10 μm to 30 μm. The mirrors 50 are arranged in, for example, from an 800×600 array to a 1028×1024 array. One mirror 50 corresponds to one pixel in an image.

The surface of the mirror 50 is a reflective surface made of a reflective metal film such as aluminum. The electro-optical device 100 includes a first level portion 100a including a substrate-side bias electrode 11 and substrate-side address electrodes 12 and 13 all of which are formed on the one surface 1s of the element substrate 1, a second level portion 100b including elevated address electrodes 32 and 33 and a hinge 35, and a third level portion 100c including the mirrors 50. In the first level portion 100a, an addressing circuit 14 is formed in the element substrate 1. The addressing circuit 14 includes memory cells for selectively controlling operation of each of the mirrors 50, and wiring lines 15 of word lines and bit lines. The addressing circuit 14 has a circuit configuration similar to a RAM (Random Access Memory) including a CMOS circuit 16.

The second level portion 100b includes the elevated address electrodes 32 and 33, the hinge 35, and a mirror post 51. The elevated address electrodes 32 and 33 conduct with the substrate-side address electrodes 12 and 13 via electrode posts 321 and 331, and are supported by the substrate-side address electrodes 12 and 13. Hinge arms 36 and 37 extend from both ends of the hinge 35. The hinge arms 36 and 37 conduct with the substrate-side bias electrode 11 via an arm post 39, and are supported by the substrate-side bias electrode 11. The mirror 50 conducts with the hinge 35 via the mirror post 51, and is supported by the hinge 35. Accordingly, the mirror 50 conducts with the substrate-side bias electrode 11 via the mirror post 51, the hinge 35, the hinge arms 36 and 37, and the arm post 39, so that a bias voltage is applied from the substrate-side bias electrode 11 to the mirror 50. At the tips of the hinge arms 36 and 37, stoppers 361, 362, 371, and 372 that come into contact with the mirror 50 when the mirror 50 is inclined to thereby prevent contact between the mirror 50 and the elevated address electrodes 32 and 33 are formed.

The elevated address electrodes 32 and 33 constitute a drive element 30 that generates an electrostatic force between the mirror 50 and the elevated address electrodes 32 and 33 to drive the mirror 50 in an inclined manner. In some cases, the substrate-side address electrodes 12 and 13 are configured also so as to generate an electrostatic force between the mirror 50 and the substrate-side address electrodes 12 and 13 to drive the mirror 50 in an inclined manner. In this case, the drive element 30 is composed of the elevated address electrodes 32 and 33 and the substrate-side address electrodes 12 and 13. The hinge 35 is twisted when the mirror 50 is inclined so as to be attracted to the elevated address electrode 32 or the elevated address electrode 33 by the application of a drive voltage to the elevated address electrodes 32 and 33 as shown in FIGS. 3A and 3B, so that the hinge 35 provides a force to return the mirror 50 to its parallel posture relative to the element substrate 1 when the attractive force for the mirror 50 disappears with the stop of the application of the drive voltage to the elevated address electrodes 32 and 33.

In the electro-optical device 100, when the mirror 50 is inclined to the elevated address electrode 32 side as one side as shown in FIG. 3A for example, an on-state is established in which the light emitted from the light source unit 1002 is reflected by the mirror 50 toward the projection optical system 1004. In contrast, when the mirror 50 is inclined to the elevated address electrode 33 side as the other side as shown in FIG. 3B, an off-state is established in which the light emitted from the light source unit 1002 is reflected by the mirror 50 toward a light-absorbing device 1005. In the off-state, the light is not reflected toward the projection optical system 1004. Such driving is performed in each of the plurality of mirrors 50, and as a result, the light emitted from the light source unit 1002 is modulated by the plurality of mirrors 50 into image light, the image light is projected from the projection optical system 1004, and thus an image is displayed.

A flat plate-like yoke facing the substrate-side address electrodes 12 and 13 may be provided integrally with the hinge 35, and an electrostatic force acting between the substrate-side address electrodes 12 and 13 and the yoke may be used in addition to the electrostatic force generated between the elevated address electrodes 32 and 33 and the mirror 50 to drive the mirror 50.

Sealing Structure of Electro-Optical Device 100

Figure 4:
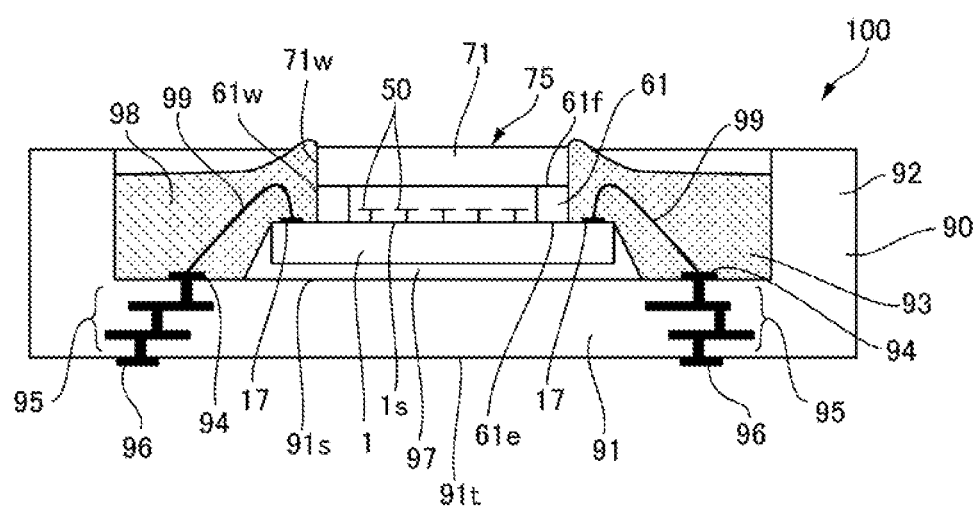
FIG. 4 is a cross-sectional view of the electro-optical device to which the invention is applied.

FIG. 4 is a cross-sectional view of the electro-optical device 100 to which the invention is applied. As shown in FIG. 4, in the electro-optical device 100 of the embodiment, the element substrate 1 in which the plurality of mirrors 50 described with reference to FIGS. 2A to 3B are formed is sealed at the one surface 1s with a sealing member 75 composed of a frame-like spacer 61 and a flat plate-like light-transmitting cover 71 having a light-transmitting property. Thereafter, the element substrate 1 is fixed to a substrate mount portion 93 of a substrate, and then sealed with a sealing resin 98. In the substrate 90, the substrate mount portion 93 is a bottomed recess surrounded by a side plate portion 92. The element substrate 1 is fixed to a bottom plate portion 91 of the substrate 90 with an adhesive 97.

Here, an edge 61e of the spacer 61 on the element substrate 1 side is bonded to the one surface 1s of the element substrate 1. The light-transmitting cover 71 is bonded to an edge 61f that is an edge of the spacer 61 on the side opposite to the edge facing the element substrate 1, and is supported to the edge 61f. In this state, the light-transmitting cover 71 faces the surfaces of the mirrors 50 at a position spaced from the mirrors 50 with a predetermined distance. Accordingly, light passes through the light-transmitting cover 71 and is incident on the mirror 50, and thereafter, the light reflected by the mirror 50 passes through the light-transmitting cover 71 and is emitted. In the embodiment, the light-transmitting cover 71 is made of glass. The spacer 61 may be made of glass, silicon, metal, or resin, and in the embodiment, a glass substrate or a silicon substrate is used as the spacer 61. The sealing member 75 is not limited to that formed of separated bodies (a plurality of members) like the spacer 61 and the light-transmitting cover 71, and the spacer 61 and the light-transmitting cover 71 may be formed into one body.

On the one surface 1s of the element substrate 1, a plurality of terminals 17 are formed at an edge (outside the spacer 61) not overlapping the mirrors 50. In the embodiment, the terminals 17 are disposed in two rows so as to interpose the mirrors 50 therebetween. A portion of the plurality of terminals 17 is electrically connected to the elevated address electrodes 32 and 33 (the drive element 30) via the addressing circuit 14 or the substrate-side address electrodes 12 and 13 described with reference to FIGS. 2A to 3B. Another portion of the plurality of terminals 17 is electrically connected to the mirrors 50 via the addressing circuit 14, the substrate-side bias electrode 11, and the hinge 35 described with reference to FIGS. 2A to 3B. Yet another portion of the plurality of terminals 17 is electrically connected to a driver circuit, etc. provided in front of the addressing circuit 14 described with reference to FIGS. 2A to 3B.

Here, since the terminals 17 are in an open state on the side opposite to the element substrate 1, the terminals 17 are electrically connected with internal terminals 94 formed on a surface 91s of the bottom plate portion 91 of the substrate 90 on the element substrate 1 side by means of wires 99 for wire bonding. The bottom plate portion 91 of the substrate 90 is a multilayer wiring board, and the internal terminals 94 conduct with external terminals 96 formed on an outer surface 91t of the bottom plate portion 91 on the side opposite to the element substrate 1 via a multilayer wiring portion 95 composed of through-holes and wiring lines formed in the bottom plate portion 91.

The sealing resin 98 is provided on the inside (recess) of the side plate portion 92 of the substrate 90. The sealing resin 98 covers the wires 99, junctions between the wires 99 and the terminals 17, junctions between the wires 99 and the internal terminals 94, the perimeter of the element substrate 1, and the perimeter of a bonding portion of the spacer 61 and the element substrate 1. The sealing resin 98 also covers the side surface of the light-transmitting cover 71 up to the middle portion in the thickness direction.

Method for Manufacturing Electro-Optical Device 100

Figure 7A:
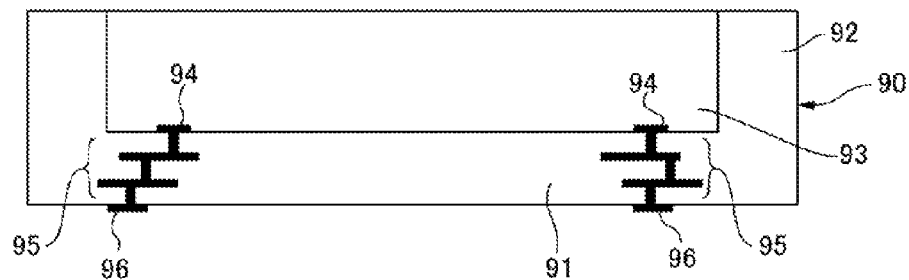
FIGS. 7A to 7C are step cross-sectional views showing a step of sealing a substrate with a substrate and a sealing resin in the manufacturing process of the electro-optical device to which the invention is applied.
Figure 7B:
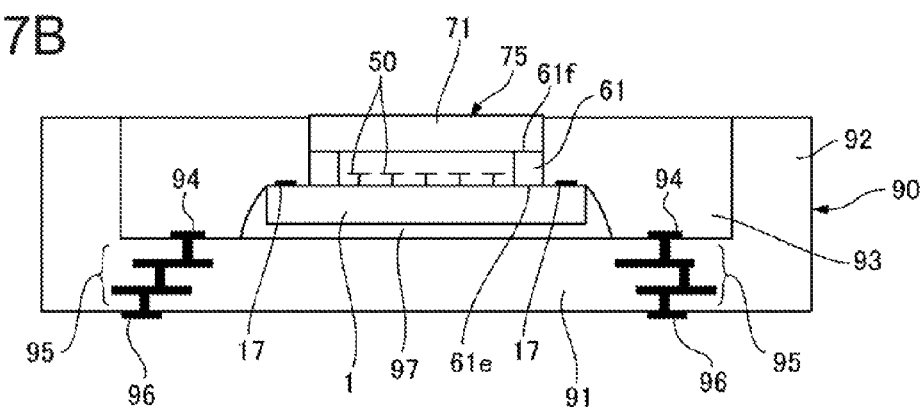
Figure 7C:
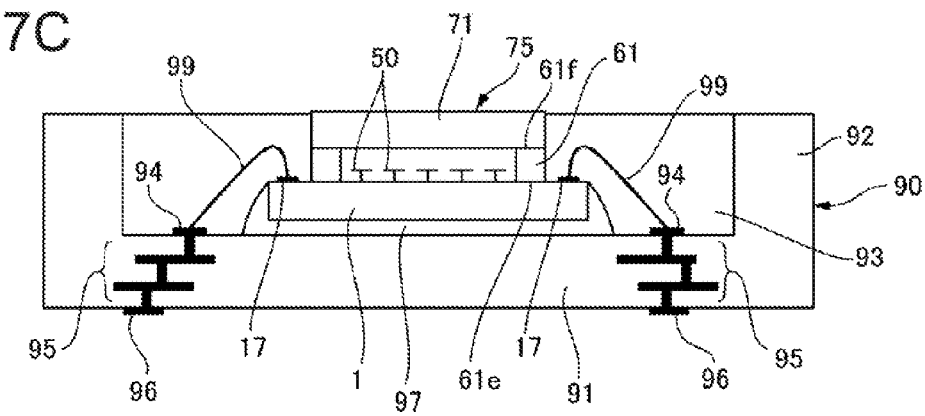

A method for manufacturing the electro-optical device 100 to which the invention is applied will be described with reference to FIGS. 5A to 7C. FIGS. 5A to 5D are step cross-sectional views showing the method for manufacturing the electro-optical device 100 to which the invention is applied. FIGS. 6A to 6F are step views showing a method for manufacturing a second wafer 20, etc. used for the manufacture of the electro-optical device 100 to which the invention is applied. In FIGS. 6A to 6F, a plan view of a wafer in each step is shown, and also a cutaway end view thereof is shown below the plan view. FIGS. 7A to 7C are step cross-sectional views showing a step of sealing the element substrate 1 with the substrate 90 and the sealing resin 98 in the manufacturing process of the electro-optical device 100 to which the invention is applied. The mirrors are not illustrated in FIG. 6B. Compared to FIG. 4, the number of mirrors 50 is reduced in FIGS. 5A to 5D, in which three mirrors 50 are shown on the assumption that three mirrors 50 are formed on one element substrate 1.

In the embodiment, a plurality of element substrates 1, etc. are obtained from a wafer. For this reason, in the following description, for example, the mirror 50 and the terminal 17 that are formed in an area from which one substrate is obtained, in the plurality of element substrates 1 obtained from a wafer, are denoted by "a" appended to the reference numerals, and described as "first mirror 50a" and "first terminal 17a", respectively. Moreover, in the plurality of element substrates 1, for example, the mirror 50 and the terminal 17 that are formed in an area next to the area where the first mirror 50a and the first terminal 17a are formed are denoted by "b" appended to the reference numerals, and described as "second mirror 50b" and "second terminal 17b", respectively. However, when it is not necessary to specify any element substrate 1, the components are described without appending the "a" or "b" to the reference numerals.

Figure 5A:
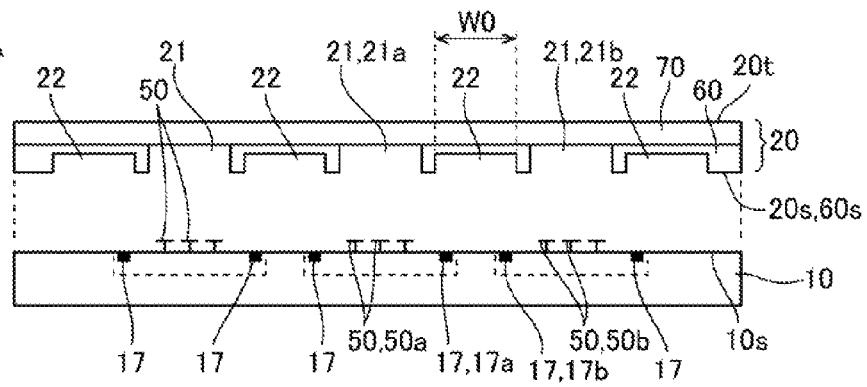
FIGS. 5A to 5D are step cross-sectional views showing a method for manufacturing the electro-optical device to which the invention is applied.

To manufacture the electro-optical device 100 of the embodiment, as shown in FIGS. 5A, 6A, and 6B, a large-sized first wafer 10 from which a plurality of element substrates 1 can be obtained is prepared in a first-wafer preparing step. The first wafer 10 includes, on one surface 10s (first surface) thereof, the mirrors 50 and the terminals 17 formed in each of areas by which the element substrate 1 is divided. The terminals 17 are formed at positions next to the mirrors 50 in a plan view (e.g., in a plan view when viewed from the one surface 10S side of the first wafer 10), and electrically connected to the drive element 30 (see FIGS. 2A to 3B) that drives the mirror 50.

On the one surface 10s of the first wafer 10, the first mirrors 50a are formed, and also the first terminals 17a electrically connected to a first drive element 30a (see FIGS. 2A to 3B) that drives the first mirrors 50a are formed at positions next to the first mirror 50a in the plan view. Moreover, on the one surface 10s of the first wafer 10, the second mirrors 50b are formed on the side opposite to the first mirrors 50a with respect to the first terminal 17a, and also the second terminals 17b electrically connected to a second drive element 30b (see FIGS. 2A to 3B) that drives the second mirror 50b are formed between the first terminals 17a and the second mirrors 50b. For example, as shown in FIGS. 5A, 6A, and 6B, the first wafer 10 may be prepared by forming, on the one surface 10s of the large-sized first wafer 10 from which a plurality of element substrates 1 can be obtained, the mirrors 50 in each of areas by which the element substrate 1 is divided, and also forming the terminals 17 electrically connected to the drive element 30 (see FIGS. 2A to 3B) that drives the mirrors 50 at positions next to the mirrors 50 in the plan view.

As shown in FIG. 5A, a large-sized second wafer 20 from which a plurality of spacers 61 and a plurality of light-transmitting covers 71 can be obtained is prepared in a second-wafer forming step. On a second surface 20s composed of one surface of the second wafer 20, a recess 21 having a light-transmitting bottom portion is formed in each of areas by which the spacer 61 and the light-transmitting cover 71 are divided, and also bottomed grooves 22 extending in two directions that intersect each other at right angles and surrounding each of the plurality of recesses 21 are formed. One of the plurality of recesses 21 is a first recess 21a, and the recess 21 next to the first recess 21a is a second recess 21b. Accordingly, the first recess 21a having the light-transmitting bottom portion, the second recess 21b having the light-transmitting bottom portion, and the bottomed grooves 22 extending along and between the first recess 21a and the second recess 21b are formed in the second surface 20s of the second wafer 20.

In the formation of the second wafer 20, for example, steps shown in FIG. 6C to 6F are performed in the second-wafer forming step. First, as shown in FIG. 6C, a light-transmitting wafer 70 (fourth wafer) from which a plurality of light-transmitting covers 71 can be obtained is prepared. Moreover, as shown in FIG. 6D, after a wafer 60 (third wafer) for spacer from which a plurality of spacers 61 can be obtained is prepared, through-holes 66 for constituting the recesses 21 are formed by a process such as etching in the wafer 60 for spacer in a first step. One of the plurality of through-holes 66 is a first through-hole 66a for constituting the first recess 21a, and the through-hole 66 next to the first through-hole 66a is a second through-hole 66b for constituting the second recess 21b. Next, as shown in FIG. 6E, the bottomed grooves 22 extending in the two directions that intersect each other at right angles and surrounding each of the plurality of recesses 21 are formed by a process such as half-etching. In the first step, the grooves 22 are formed after the through-holes 66 are formed, but the through-holes 66 may be formed after the grooves 22 are formed. In the embodiment, the light-transmitting cover 71 is made of glass. The wafer 60 for spacer may be made of glass, silicon, metal, or resin.

Next, in a second step as shown in FIG. 6F, the light-transmitting wafer 70 is stacked on and bonded to a surface 60t of the wafer 60 for spacer on the side opposite to a surface 60s thereof in which the grooves 22 are opened. As a result, the second wafer 20 including the wafer 60 for spacer and the light-transmitting wafer 70 stacked together is formed. In the second wafer 20, the surface 60s of the wafer 60 for spacer constitutes the second surface 20s of the second wafer 20, while a surface of the light-transmitting wafer 70 on the side opposite to the wafer 60 for spacer constitutes a third surface 20t of the second wafer 20. Moreover, one open end of the through-hole 66 (the first through-hole 66a and the second through-hole 66b) is closed by the light-transmitting wafer 70, so that the recess 21 (the first recess 21a and the second recess 21b) having the light-transmitting bottom portion is formed.

Figure 5B:
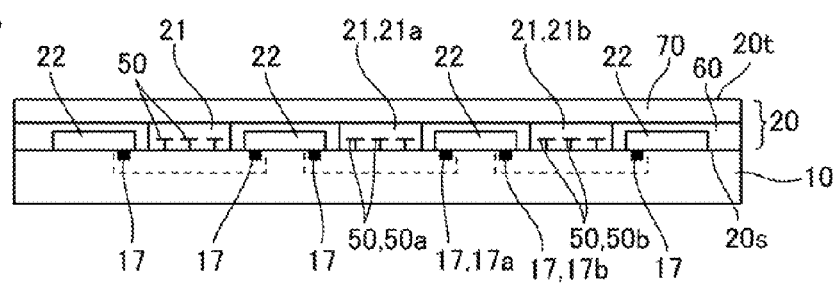

Next, in a bonding step as shown in FIG. 5B, the one surface 10s of the first wafer 10 and the second surface 20s of the second wafer 20 are bonded together in a manner such that the recesses 21 overlap the mirrors 50 in a plan view (e.g., in a plan view when the first wafer 10 is viewed from the one surface 10s side), and that the grooves 22 overlap the terminals 17. As a result, the first recess 21a overlaps the first mirrors 50a in the plan view, the second recess 21b overlaps the second mirrors 50b in the plan view, and a common groove 22 overlaps in the plan view the first terminal 17a, the second terminal 17b, and an area interposed between the first terminal 17a and the second terminal 17b. In this state, a portion interposed between the first recess 21a and the groove 22 in the second wafer 20 is bonded between the first mirror 50a and the first terminal 17a, and a portion interposed between the second recess 21b and the groove 22 in the second wafer 20 is bonded between the second mirror 50b and the second terminal 17b. Accordingly, the first terminal 17a and the second terminal 17b are not bonded to the second wafer 20.

Figure 5C:
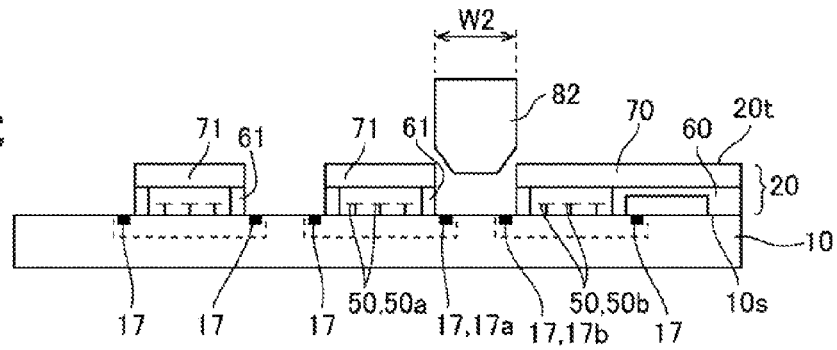

Next, in a second-wafer dicing step as shown in FIG. 5C, the second wafer 20 is diced along the grooves 22 by advancing a dicing blade 82 for second wafer (first dicing blade) from the third surface 20t composed of a surface of the second wafer 20 on the side opposite to the second surface 20s. As a result, the second wafer 20 is divided, a flat plate portion divided from the light-transmitting wafer 70 in the second wafer 20 constitutes the light-transmitting cover 71, and a frame portion divided from the wafer 60 for spacer in the second wafer 20 constitutes the spacer 61. In the embodiment, a thickness W2 of the dicing blade 82 for second wafer is equal to a width W0 of the groove 22.

Figure 5D:
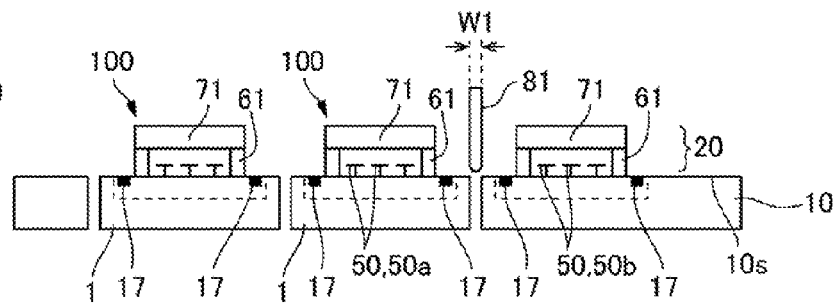

Next, in a first-wafer dicing step as shown in FIG. 5D, the first wafer 10 is diced with a dicing blade 81 for first wafer (second dicing blade) along an area (area interposed between the first terminal 17a and the second terminal 17b) by which the element substrate 1 is divided in the first wafer 10. As a result, the first wafer 10 is diced between the first terminal 17a and the second terminal 17b. In the embodiment, a thickness W1 of the dicing blade 81 for first wafer is smaller than the thickness W2 of the dicing blade 82 for second wafer. Accordingly, in the first-wafer dicing step, the first wafer 10 is diced by advancing the dicing blade 81 for first wafer to the first wafer 10 from the second wafer 20 side into a cut portion (between the light-transmitting covers 71 next to each other and between the spacers 61 next to each other) of the second wafer 20.

As a result, a plurality of electro-optical devices 100 in which the one surface 1s of the element substrate 1 including a plurality of mirrors 50 formed thereon is sealed by the spacer 61 and the light-transmitting cover 71 are manufactured. When the electro-optical device 100 is further sealed by the substrate 90 and the sealing resin 98 as shown in FIG. 4, steps shown in FIGS. 7A to 7C are performed.

First, as shown in FIG. 7A, after the substrate 90 having the substrate mount portion 93 as a recess surrounded by the side plate portion 92 is prepared, the element substrate 1 is fixed to the bottom portion of the substrate mount portion 93 with the adhesive 97 as shown in FIG. 7B. Next, as shown in FIG. 7C, the terminals 17 of the element substrate 1 and the internal terminals 94 of the substrate 90 are electrically connected by means of the wires 99 for wire bonding. Next, as shown in FIG. 4, after the sealing resin 98 is injected inside the side plate portion 92 of the substrate 90, the sealing resin 98 is cured to seal the element substrate 1 with the sealing resin 98. As a result, the electro-optical device 100 in which the element substrate 1 is sealed by the spacer 61, the light-transmitting cover 71, the substrate 90, and the sealing resin 98 can be obtained.

Principal Advantageous Effects of the Embodiment

In the embodiment as has been described above, after the first wafer 10 and the second wafer 20 for sealing are bonded together, the first wafer 10 and the second wafer 20 are diced to manufacture a plurality of electro-optical devices 100. In doing so, the groove 22 overlapping in the plan view the first terminal 17a, the second terminal 17b, and the area interposed between the first terminal 17a and the second terminal 17b is previously formed in the second wafer 20. Accordingly, in the embodiment, the second wafer 20 is separated from the first terminal 17a and the second terminal 17b in a state where the first wafer 10 and the second wafer 20 are bonded together. For this reason, the first terminal 17a and the second terminal 17b are not bonded to the second wafer 20. Moreover, in the second-wafer dicing step, the second wafer 20 is diced before the dicing blade 82 for second wafer comes close to the first terminal 17a and the second terminal 17b. Accordingly, the dicing blade 82 for second wafer is less likely to come into contact with the first terminal 17a and the second terminal 17b and cause damage to the first terminal 17a and the second terminal 17b. Hence, the yield of the electro-optical device 100 can be improved.

Moreover, in the embodiment, the first-wafer dicing step and the second-wafer dicing step are separately performed. Therefore, less chipping or cracking occurs in the first wafer 10.

Modified Examples 1 and 2 of the Invention

Figure 8A:
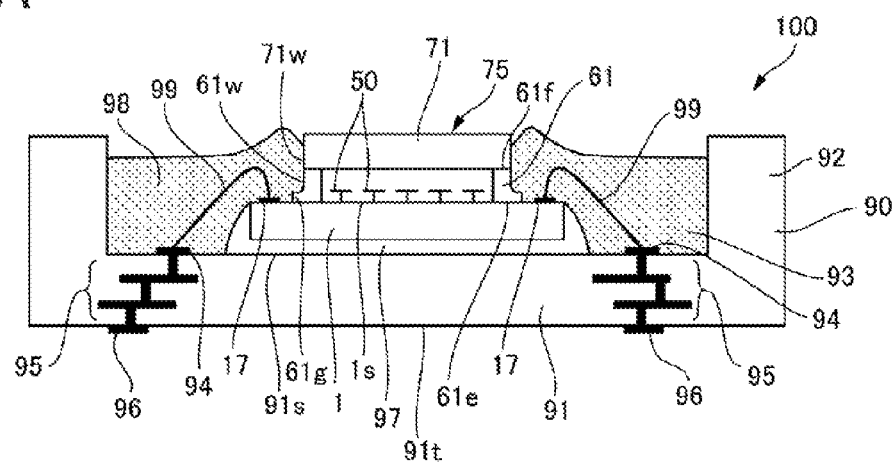
FIGS. 8A and 8B are explanatory views showing Modified Examples 1 and 2 of the method for manufacturing the electro-optical device to which the invention is applied.
Figure 8B:
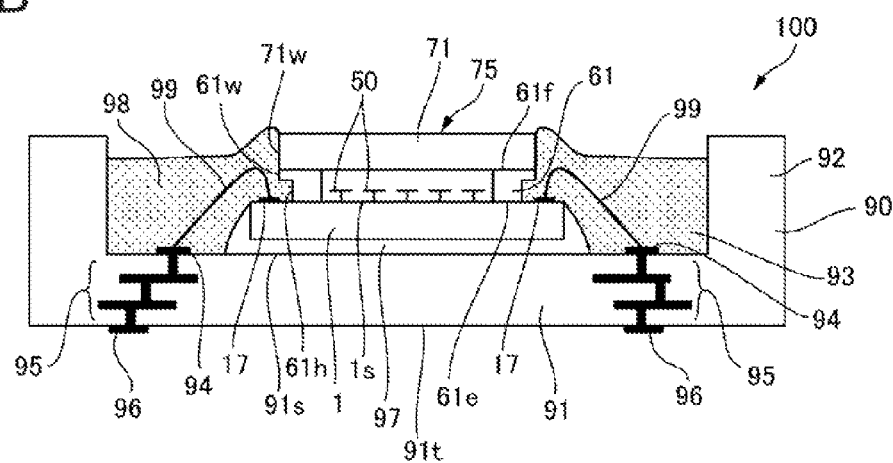

FIGS. 8A and 8B are explanatory views showing Modified Examples 1 and 2 of the method for manufacturing the electro-optical device 100 to which the invention is applied, in which FIG. 8A is a cross-sectional view of the electro-optical device 100 according to Modified Examples 1, and FIG. 8B is a cross-sectional view of the electro-optical device 100 according to Modified Examples 2. In the embodiment described above, the thickness W2 of the dicing blade 82 for second wafer shown in FIG. 5C is equal to the width W0 of the groove 22. Therefore, as shown in FIG. 4, the side surface 71w of the light-transmitting cover 71 and an outer side surface 61w of the spacer 61 on the side opposite to the mirror 50 form a continuous plane over the entire side surface.

In contrast, in Modified Examples 1, the thickness W2 of the dicing blade 82 for second wafer shown in FIG. 5C is greater than the width W0 of the groove 22. For this reason, as shown in FIG. 8A, in the Side Surface 71w of the light-transmitting cover 71 and the outer side surface 61w of the spacer 61 as a surface on the side opposite to a surface facing the mirror 50, the edge 61e of the spacer 61 on the element substrate 1 side is a projection 61g that projects opposite to the mirror 50 beyond a portion of the spacer 61 located on the side opposite to the element substrate 1. In other words, the projection 61g, which is a second portion closer to the element substrate 1 than a first portion and projects opposite to the mirror 50 beyond the first portion, is formed on the side surface (the side surface 71w of the light-transmitting cover 71 and the outer side surface 61w of the spacer 61) of the sealing member 75 composed of the spacer 61 and the light-transmitting cover 71. For this reason, since the terminal 17 is greatly opened on the side opposite to the element substrate 1, it is easy to perform wire bonding. Also in this case, since the area (bonding width) of bonding the spacer 61 with the element substrate 1 is not reduced, a sealing property between the spacer 61 and the element substrate 1 is not reduced.

In Modified Examples 2, on the other hand, the thickness W2 of the dicing blade 82 for second wafer shown in FIG. 5C is smaller than the width W0 of the groove 22. For this reason, as shown in FIG. 8B, in the side surface 71w of the light-transmitting cover 71 and the outer side surface 61w of the spacer 61 on the side opposite to the mirror 50, the edge 61e of the spacer 61 on the element substrate 1 side is a recess 61h recessed to the mirror 50 side beyond the portion of the spacer 61 located on the side opposite to the element substrate 1. In other words, the recess 61h, which is a second portion closer to the element substrate 1 than a first portion and recessed to the mirror 50 side beyond the first portion, is formed in the side surface (the side surface 71w of the light-transmitting cover 71 and the outer side surface 61w of the spacer 61) of the sealing member 75 composed of the spacer 61 and the light-transmitting cover 71. Also in this case, since the area (bonding width) of bonding the spacer 61 with the light-transmitting cover 71 is not reduced, a sealing property between the spacer 61 and the light-transmitting cover 71 is not reduced.

Modified Example 3 of the Invention

Figure 9A:
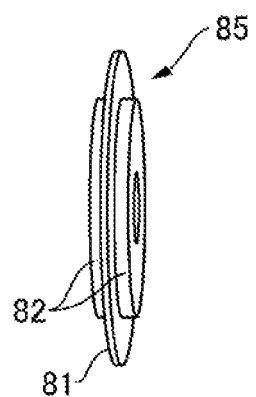
FIGS. 9A and 9B are explanatory views showing Modified Example 3 of the method for manufacturing the electro-optical device to which the invention is applied.
Figure 9B:
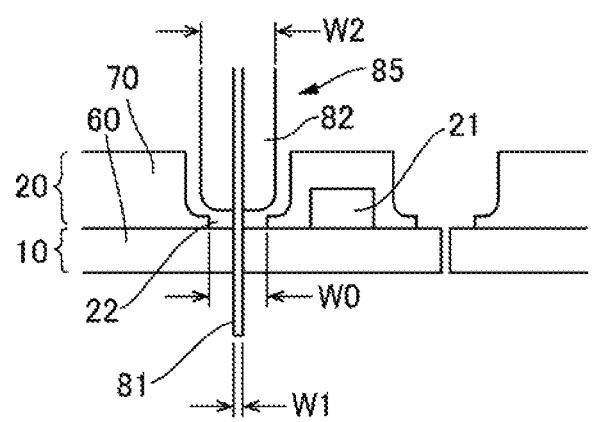

FIGS. 9A and 9B are explanatory views showing Modified Example 3 of the method for manufacturing the electro-optical device 100 to which the invention is applied, in which FIG. 9A is an explanatory view of a dicing blade used in Modified Examples 3, and FIG. 9B is an explanatory view showing a state of dicing the first wafer 10 and the second wafer 20 with the dicing blade used in Modified Examples 3.

In Modified Example 3, as shown in FIGS. 9A and 9B, a multistage blade 85 including the dicing blade 81 for first wafer and the dicing blade 82 for second wafer concentrically stacked together in the thickness direction is used in the second-wafer dicing step and the first-wafer dicing step shown in FIGS. 5C and 5D. In the multistage blade 85, the dicing blade 81 for first wafer has a diameter greater than the dicing blade 82 for second wafer, and the dicing blade 82 for second wafer projects from both surfaces of the dicing blade 81 for first wafer. Accordingly, the thickness W2 of the dicing blade 82 for second wafer is greater than the thickness W1 of the dicing blade 81 for first wafer. According to the multistage blade 85, the second-wafer dicing step and the first-wafer dicing step can be continuously performed in the same step by advancing the multistage blade 85 to the first wafer 10 from the second wafer 20 side.

Although the thickness W2 of the dicing blade 82 for second wafer is greater than the width W0 of the groove 22 in the step shown in FIG. 9B, the thickness W2 of the dicing blade 82 for second wafer may be smaller than the width W0 of the groove 22.

Modified Example 4 of the Invention

FIGS. 10A to 10D are explanatory views showing Modified Example 4 of the method for manufacturing the electro-optical device 100 to which the invention is applied, and FIGS. 10A to 10D are step views showing a method for manufacturing the second wafer 20, etc. used for the manufacture of the electro-optical device 100. In FIGS. 10A to 10D, a plan view of a wafer in each step is shown, and also a cutaway end view thereof is shown below the plan view.

Figures 10A, 10B, 10C, 10D:
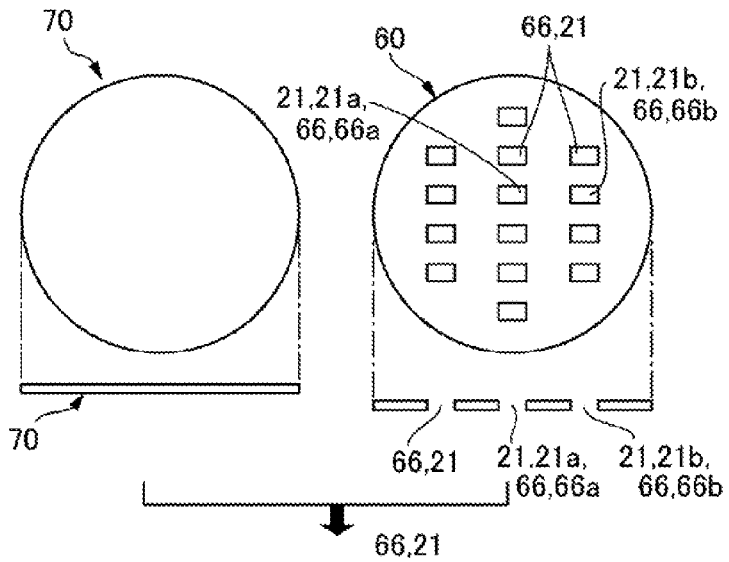
FIGS. 10A to 10D are explanatory views showing Modified Example 4 of the method for manufacturing the electro-optical device to which the invention is applied.
Figure 11A:
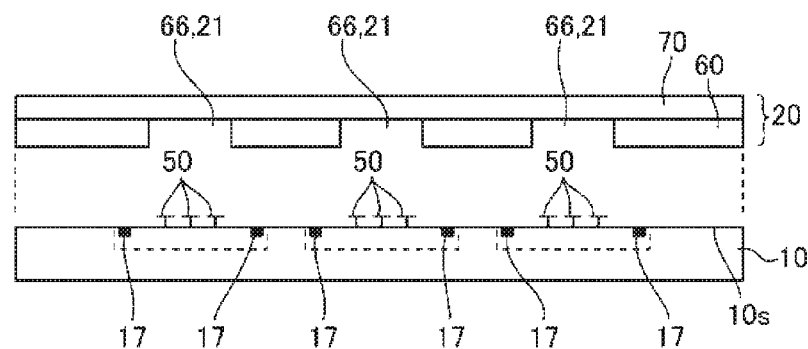
FIGS. 11A to 11D are step cross-sectional views showing a method for manufacturing an electro-optical device according to a reference example of the invention.
Figure 11B:
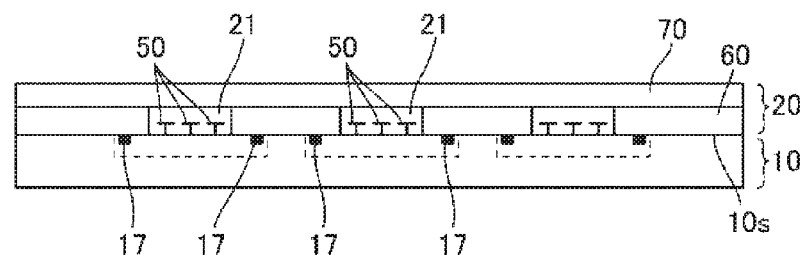
Figure 11C:
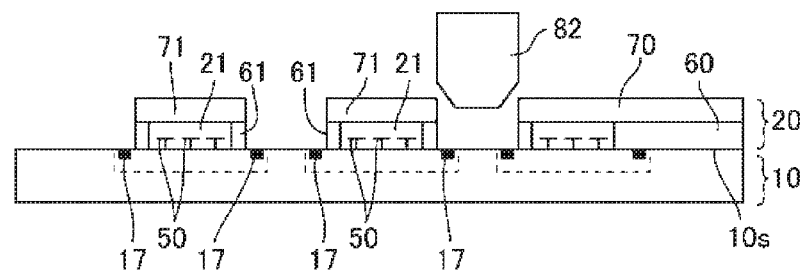
Figure 11D:
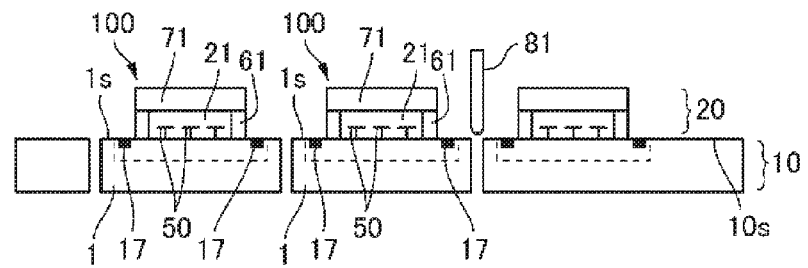

In Modified Example 4, in the second-wafer forming step of forming the second wafer 20 shown in FIG. 5A, the light-transmitting wafer 70 from which a plurality of light-transmitting covers 71 can be obtained is first prepared as shown in FIG. 10A. Moreover, as shown in FIG. 10B, after the wafer 60 for spacer from which a plurality of spacers 61 can be obtained is prepared, the through-holes 66 for constituting the recesses 21 are formed in the wafer 60 for spacer by a process such as etching in a first step. One of the plurality of through-holes 66 is the first through-hole 66a for constituting the first recess 21a, and the through-hole 66 next to the first through-hole 66a is the second through-hole 66b for constituting the second recess 21b.

In a second step, the wafer 60 for spacer and the light-transmitting wafer 70 are stacked and bonded together. As a result, one open end of the through-hole 66 (the first through-hole 66a and the second through-hole 66b) is closed by the light-transmitting wafer 70, so that the recess 21 (the first recess 21a and the second recess 21b) having the light-transmitting bottom portion is formed.

Next, in a third step, the bottomed grooves 22 extending in the two directions that intersect each other at right angles and surrounding each of the plurality of recesses 21 are formed by a process such as half-etching in the surface 60s of the wafer 60 for spacer on the side opposite to the surface bonded with the light-transmitting wafer 70. As a result, the second wafer 20 including the wafer 60 for spacer and the light-transmitting wafer 70 stacked together is formed. In the second wafer 20, the surface 60s of the wafer 60 for spacer constitutes the second surface 20s of the second wafer 20, and the surface of the light-transmitting wafer 70 on the side opposite to the wafer 60 for spacer constitutes the third surface 20t of the second wafer 20.

Modified Example 5 of the Invention

In the embodiment described above, the recess 21 (the through-hole 66) and the groove 22 are formed by a process such as etching. However, the second wafer 20 in which the recesses 21 and the grooves 22 are formed may be formed by molding, etc. Moreover, the second wafer 20 may be formed using the wafer 60 for spacer in which the through-holes 66 and the grooves 22 are formed by molding, etc.

Another Embodiment

In the embodiment described above, a circular wafer is used. However, the planar shape of a wafer may be rectangular, etc.

What is claimed is:

1. A method for manufacturing an electro-optical device, comprising:
    preparing a first wafer including, on a first surface side, a first mirror, a first terminal, a second mirror, and a second terminal, the first terminal being provided at a position next to the first mirror in a plan view, the first terminal being electrically connected to a first drive element driving the first mirror, the second mirror being located on the side opposite to the first mirror with respect to the first terminal, the second terminal being provided between the first terminal and the second mirror, the second terminal being electrically connected to a second drive element driving the second mirror;
    forming a second wafer including a second surface provided with a first recess having a light-transmitting bottom portion, a second recess having a light-transmitting bottom portion, and a groove between the first recess and the second recess;
    bonding the first surface of the first wafer and the second surface of the second wafer together in a manner such that the first recess overlaps the first mirror in the plan view, that the second recess overlaps the second mirror in the plan view, and that the groove overlaps in the plan view the first terminal, the second terminal, and an area interposed between the first terminal and the second terminal;
    dicing the second wafer along the groove by advancing a first dicing blade from a third surface of the second wafer on the side opposite to the second surface, wherein the thickness of the first dicing blade is greater than the width of the groove; and
    dicing the first wafer between the first terminal and the second terminal with a second dicing blade.

2. The method for manufacturing an electro-optical device according to claim 1, wherein
    the thickness of the second dicing blade is smaller than the thickness of the first dicing blade, and
    in the dicing of the first wafer, the first wafer is diced by advancing the second dicing blade to the first wafer from the second surface side.

3. The method for manufacturing an electro-optical device according to claim 1, wherein
    a multistage blade including the second dicing blade and the first dicing blade stacked together in a thickness direction is used, and
    the dicing of the second wafer and the dicing of the first wafer are continuously performed by advancing the multistage blade to the first wafer from the second wafer side.

4. The method for manufacturing an electro-optical device according to claim 1, wherein
    the forming of the second wafer includes
        forming a first through-hole, a second through-hole, and the groove in a third wafer, and
        stacking and bonding a light-transmitting fourth wafer on and to a surface of the third wafer on the side opposite to the side where the groove is opened.

5. The method for manufacturing an electro-optical device according to claim 1, wherein
    the forming of the second wafer includes
        forming a first through-hole and a second through-hole in a third wafer,
        stacking and bonding the third wafer and a light-transmitting fourth wafer together, and
        forming the groove in a surface of the third wafer on the side opposite to a surface thereof bonded with the fourth wafer.

* * * * *